United States Patent
Chen et al.

(10) Patent No.: US 11,342,698 B2
(45) Date of Patent: May 24, 2022

(54) LAYOUT METHOD FOR BACKPLANE CONNECTOR, BACKPLANE AND ELECTRONIC TERMINAL

(71) Applicant: Celestica Technology Consultancy (Shanghai) Co. Ltd, Shanghai (CN)

(72) Inventors: Yaxu Chen, Shanghai (CN); Keming Ying, Shanghai (CN)

(73) Assignee: Celestica Technology Consultancy (Shanghai) Co. Ltd, Shanghai (CN)

( * ) Notice: Subject to any disclaimer, the term of this patent is extended or adjusted under 35 U.S.C. 154(b) by 0 days.

(21) Appl. No.: 16/871,053

(22) Filed: May 11, 2020

(65) Prior Publication Data

US 2021/0194163 A1    Jun. 24, 2021

(51) Int. Cl.
*H01R 12/73*    (2011.01)
*H01R 25/00*    (2006.01)

(52) U.S. Cl.
CPC ........... *H01R 12/73* (2013.01); *H01R 25/006* (2013.01)

(58) Field of Classification Search
CPC ...... H01R 12/73; H01R 25/006; H01R 12/52; H05K 1/14
See application file for complete search history.

(56) References Cited

U.S. PATENT DOCUMENTS

| | | | | |
|---|---|---|---|---|
| 5,130,894 A | * | 7/1992 | Miller | H05K 7/023 361/735 |
| 7,955,087 B2 | * | 6/2011 | Zhou | H05K 7/1445 439/62 |
| 2007/0178718 A1 | * | 8/2007 | Li | H01R 12/52 439/65 |

* cited by examiner

*Primary Examiner* — Tho D Ta (57) ABSTRACT

The disclosure provides a layout method for backplane connector, a backplane, and an electronic terminal. The backplane includes: a circuit board; and a first connector unit. The first connector unit includes at least one group of first connector modules, each group of the first connector modules comprises a front connector and a back connector; pins in odd-numbered columns of the front connector have the same arrangement as pins in odd-numbered columns of the back connector, pins in even-numbered columns of the front connector have the same arrangement as pins in even-numbered columns of the back connector; the front connector is mounted on the front of the circuit board, the back connector is on the back of the circuit board, and the back connector is staggered one column of pins relative to the front of the front connector.

7 Claims, 10 Drawing Sheets

LAYOUT METHOD FOR BACKPLANE CONNECTOR, BACKPLANE AND ELECTRONIC TERMINAL

CROSS REFERENCES TO RELATED APPLICATIONS

This application claims priority of a Chinese Patent Application No. 2019113382079, filed on Dec. 23, 2019, and claims priority of a Chinese Patent Application No. 2019223781992, filed on Dec. 23, 2019, the contents of which are hereby incorporated by reference in their entireties for all purposes.

TECHNICAL FIELD

The present disclosure relates to the technical field of electronic devices, and in particular, to a layout method for backplane connector, a backplane, and an electronic terminal.

BACKGROUND

For servers, storages and industrial computers on the market which have dual control modules and dual backplanes, the methods for connecting the two backplanes generally include:

Method 1: the two backplanes are connected by cables. This method has a simple design, but when the number of required cables is too large, the cost is high, the system layout is messy, and it is inconvenient for maintenance.

Method 2: the two backplanes are connected through a bridge board. The system layout is regular and is easy for maintenance. In this method, no cable is used, the cost is lower than the cable connection method. However, when there are too many connectors on the backplanes, the backplanes will not have enough ventilation holes, resulting in reducing of the feasibility.

The method for connecting two backplanes with a bridge circuit board is mostly used when the backplanes require fewer connectors, and the connectors can be completely staggered. When there are too many connectors on the backplane, a cable connection is commonly used.

SUMMARY

The present disclosure provides a layout method for backplane connector, a backplane and an electronic terminal for solving the problems of large area of wiring and small area of ventilation when connectors are arranged on both sides of backplane.

The present disclosure provides a backplane. The backplane includes a circuit board and a first connector unit. The first connector unit includes at least one group of first connector modules, each group of the first connector modules includes a front connector and a back connector; pins in odd-numbered columns of the front connector have the same arrangement as pins in odd-numbered columns of the back connector, pins in even-numbered columns of the front connector have the same arrangement as pins in even-numbered columns of the back connector; the front connector is placed on the front of the circuit board, the back connector is placed on the back of the circuit board, and the back connector is staggered one column of pins relative to the front of the front connector.

In an embodiment of the present disclosure, a first column of the front connector is vacantly connected, a second column to an Nth column of the front connector are sequentially connected with a first column to an N−1 column of the back connector, an Nth column of the back connector is vacantly connected; alternatively, the first column of the back connector is vacantly connected, a second column to the Nth column of the back connector are sequentially connected with the first column to an N−1 column of the front connector, and the Nth column of the front connector is vacantly connected; N is a positive integer and N≥2.

In an embodiment of the present disclosure, the first connector unit is disposed in any one of an upper left region, an upper middle region, an upper right region, a lower left region, a lower middle region, and a lower right region of the circuit board.

In an embodiment of the present disclosure, the backplane further includes: a second connector unit, the second connector unit includes at least one group of second connector modules; each group of the second connector modules includes a front connector and a back connector, the front connector of the second connector module is placed on the front of the circuit board, the back connector of the second connector module is placed on the back of the circuit board, and staggered the entire front connector of the second connector module.

In an embodiment of the present disclosure, the first connector unit is disposed in an upper middle region or a lower middle region of the circuit board; the front connector of the second connector module of the second connector unit is disposed in the lower middle region or upper middle region of the circuit board, and the back connector of the second connector module of the second connector unit is uniformly arranged on both sides of the back connector in the first connector unit.

In an embodiment of the disclosure, the circuit board further includes a plurality of ventilation holes.

The present disclosure further provides a layout method for backplane connector, including: providing a circuit board; and providing a first connector unit. The first connector unit includes at least one group of first connector modules, each group of the first connector modules includes a front connector and a back connector; pins in odd-numbered columns of the front connector have the same arrangement as pins in odd-numbered columns of the back connector, pins in even-numbered columns of the front connector have the same arrangement as pins in even-numbered columns of the back connector; the front connector is placed on the front of the circuit board, the back connector is placed on the back of the circuit board, and the back connector is staggered one column of pins relative to the front of the front connector.

In an embodiment of the present disclosure, a first column of the front connector is vacantly connected, a second column to an Nth column of the front connector are sequentially connected with a first column to an N−1 column of the back connector, an Nth column of the back connector is vacantly connected; alternatively, the first column of the back connector is vacantly connected, a second column to the Nth column of the back connector are sequentially connected with the first column to an N−1 column of the front connector, and the Nth column of the front connector is vacantly connected; N is a positive integer and N≥2.

The present disclosure further provides an electronic terminal, including a backplane. The backplane includes a circuit board and a first connector unit. The first connector unit includes at least one group of first connector modules, each group of the first connector modules includes a front connector and a back connector; pins in odd-numbered columns of the front connector have the same arrangement as pins in odd-numbered columns of the back connector, pins in even-numbered columns of the front connector have the same arrangement as pins in even-numbered columns of the back connector; the front connector is placed on the front of the circuit board, the back connector is placed on the back of the circuit board, and the back connector is staggered one column of pins relative to the front of the front connector.

The backplane in the present disclosure has the following beneficial effects:

1. In the present disclosure, the signals on the front and back of the backplane are connected directly, which reduces the wiring on the circuit board, thereby reducing the area and number of layers of the circuit board required by signal wiring, and saving costs.

2. The length of the high-speed signal wiring on the backplane is minimized, the signal attenuation of the high-speed signal wiring caused by the circuit board is minimized, and the signal quality is improved.

3. In the present disclosure, fewer signal wirings are used, the front connector and back connector are overlapped, the large area is left for the ventilation holes of the backplane, thereby enhancing the air flow and improving the heat dissipation of the system.

4. In the present disclosure, the area of the ventilation hole is increased, the demand for the power of the fan in the system is reduced, thereby reducing the cost of the fan in the system and further reducing the system cost.

DESCRIPTION OF REFERENCE NUMERALS

100 Backplane
110 Circuit board
120 First connector unit
121 Front connector
122 Back connector
130 Second connector unit
131 Front connector
132 Back connector
141, 142 Ventilation holes
11, 12 Ventilation holes

DETAILED DESCRIPTION OF THE PREFERRED EMBODIMENTS

The embodiments of the present disclosure will be described below. Those skilled in the art can easily understand other advantages and effects of the present disclosure according to contents disclosed by the specification. The present disclosure can also be implemented or applied through other different specific implementation modes. Various modifications or changes can also be made to all details in the specification based on different points of view and applications without departing from the spirit of the present disclosure.

Referring to FIGS. 1-6. It should be understood that the structures, proportions, sizes, and the like, which are illustrated in the drawings of the present specification, are only used to clarify the contents disclosed in the specification for understanding and reading by those skilled, and are not intended to limit the implementation of the present disclosure, thus are not technically meaningful. Any modification of the structure, change of the scale, or adjustment of the size should still fall within the scope of the technical contents disclosed by the present disclosure without affecting the effects and achievable objectives of the present disclosure. In the meantime, the terms "upper", "lower", "left", "right", "intermediate" and "one" as used in this specification are also for convenience of description, and are not intended to limit the scope of the present disclosure, and the change or adjustment of the relative relationship is considered to be within the scope of the present disclosure without substantial changes in technology.

Figure 1:
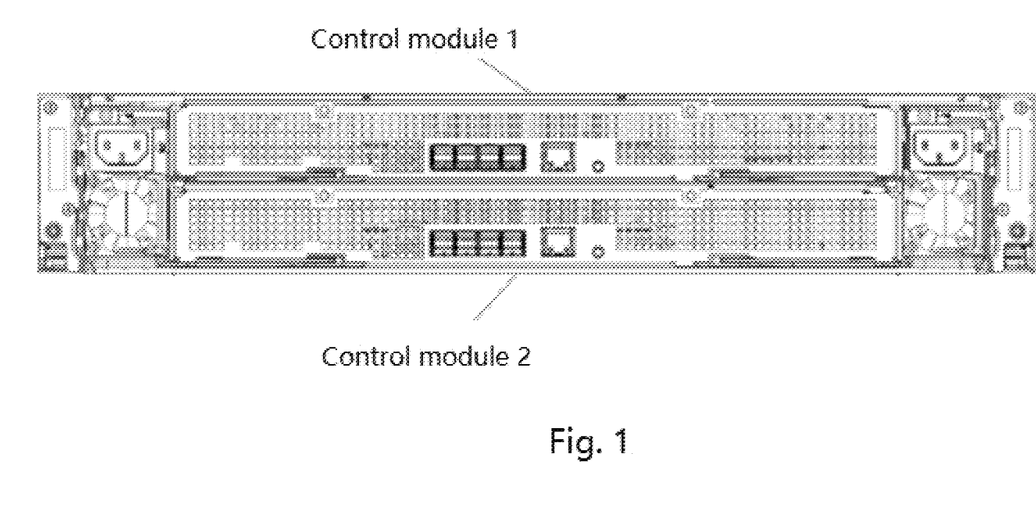
FIG. 1 is a back view of a dual-control-module dual-backplane system.
Figure 2:
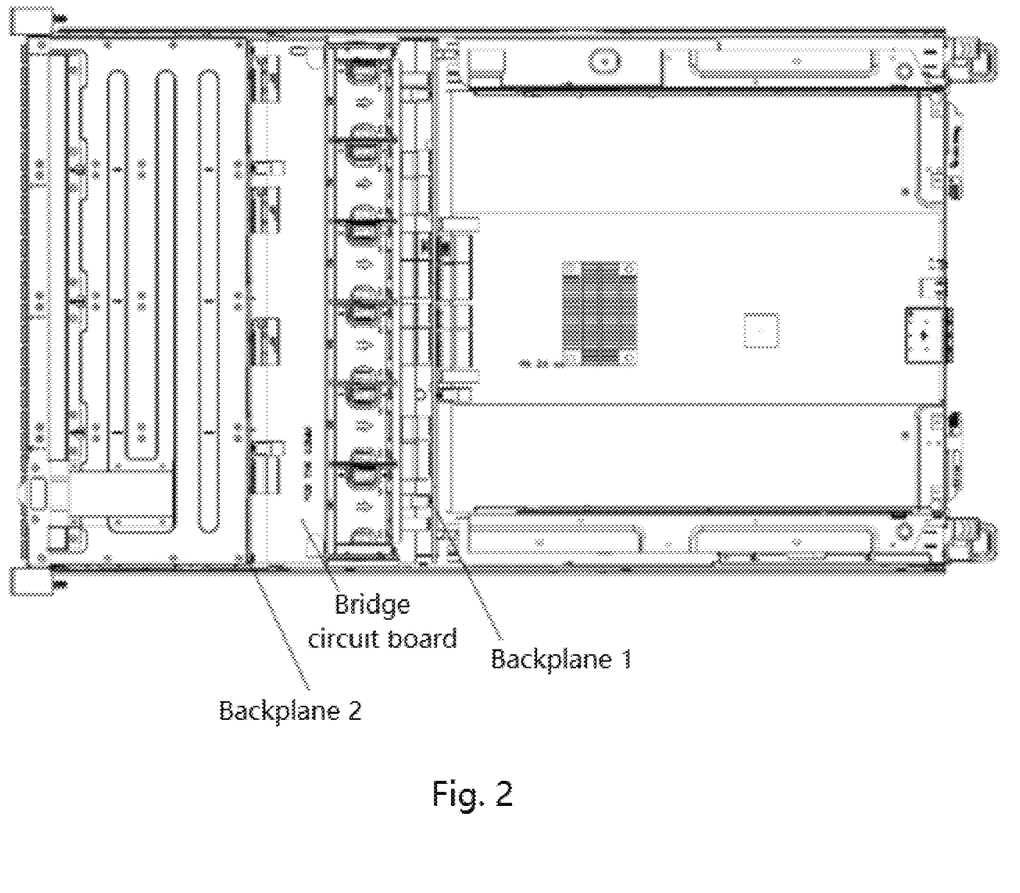
FIG. 2 is a top view of a dual-control-module dual-backplane system.

FIGS. 1 and 2 show a typical system with dual control modules and dual backplanes. The two backplanes are connected via a bridge circuit board.

The backplane 1 is connected with circuit boards of a control module 1, circuit boards of a control module 2, and a bridge circuit board. The design is complicated. Many connectors need to be disposed on both the front side and the back side of the backplane 1, as shown in FIGS. 3 and 4.

Figure 3:
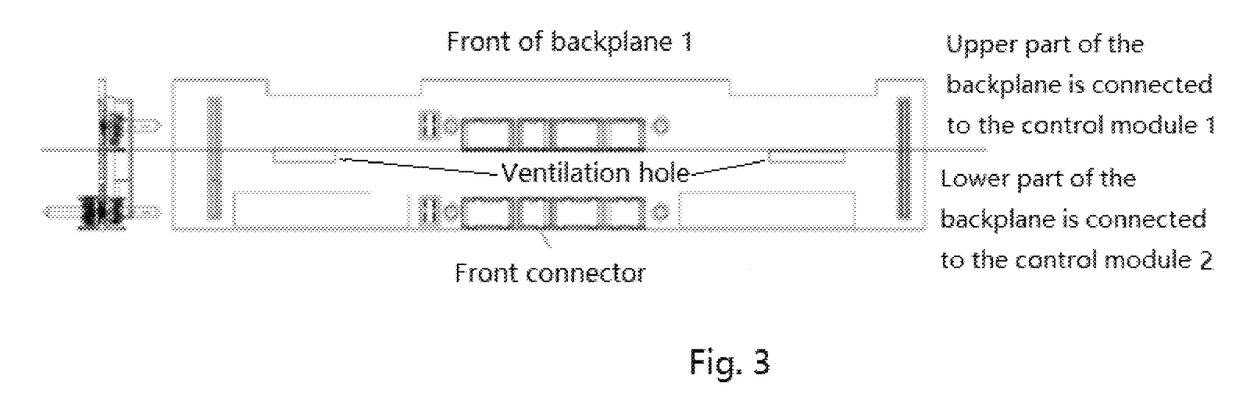
FIG. 3 is a front view of a backplane.
Figure 4:
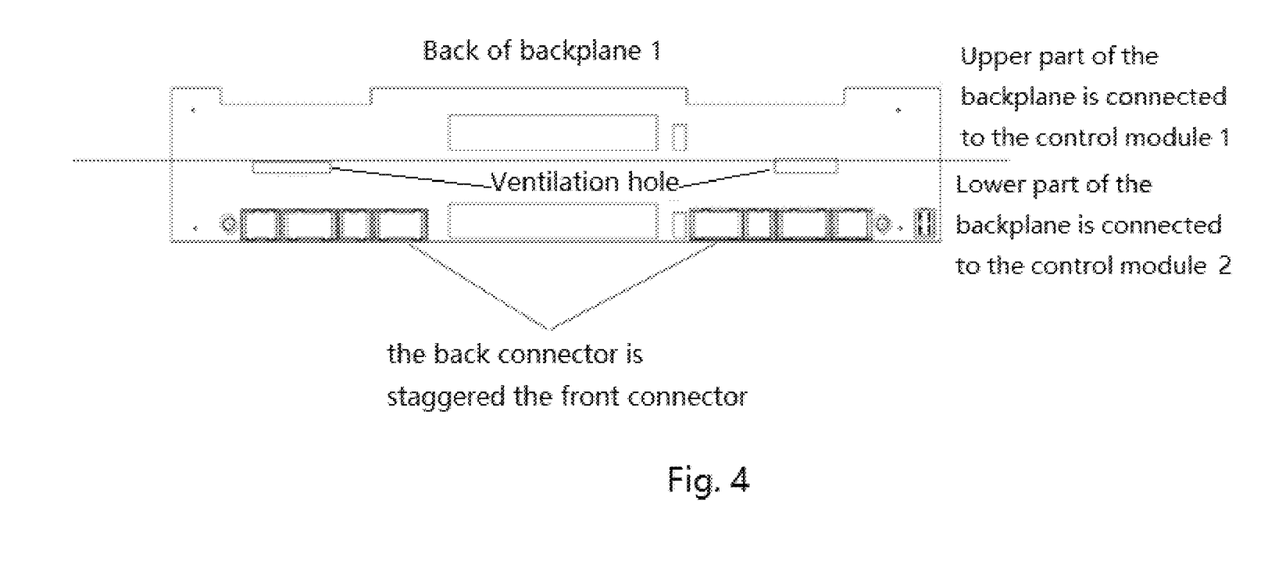
FIG. 4 is a back view of a backplane.
Figure 5:
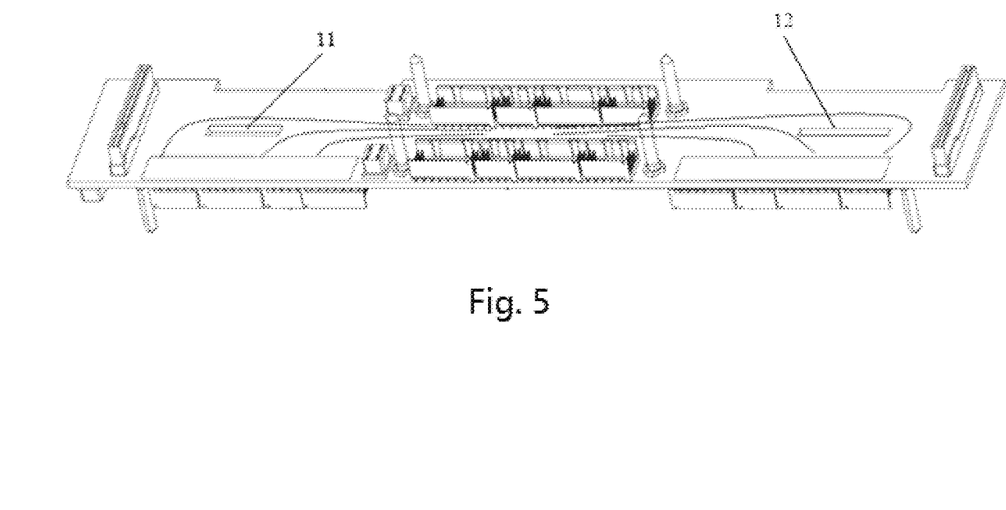
FIG. 5 shows backplane and connectors placement and signals routing.

It can be seen from FIGS. 3 and 4 that the connectors on the front side and the back side are part or completely staggered to avoid connector interference. Due to this layout, most of the lower part of the backplane 1 is occupied by connectors on both sides. In addition, since additional wiring space needs to be reserved for the signals from the two control modules, as shown in FIG. 5, the area of the ventilation hole 11 and the ventilation hole 12 in the lower part of the backplane 1 is very small.

When a plurality of connectors is required, this layout of the backplane 1 may cause the following problems:

1) Within a limited space for server or storage chassis, and length of the backplane is limited, it is impossible to completely avoid the connectors interfering with each other, making the architecture unfeasible.

2) Even if the connectors on the front side and the back side are staggered from each other, there may be too many connectors, most area of the backplane is occupied, resulting in a very limited area for ventilation holes on the backplane, which cannot meet the requirements for heat dissipation of the system.

3) The signal wirings from the two control modules need to occupy a certain area of the circuit board. Although the area required for signal wiring can be reduced by increasing the number of circuit board layers, increasing the number of circuit board layers will greatly increase the cost of the circuit board, and increasing the cost of the system.

The present disclosure provides a layout method for backplane connector, a backplane, and an electronic terminal. The present disclosure solves the problem that wirings occupy large area and the ventilation area is small when connectors are disposed on both sides of the backplane.

The following will describe the layout method of backplane connector, backplane and electronic terminal in detail, so that those skilled in the art can understand this embodiment without creative work.

Figure 6:
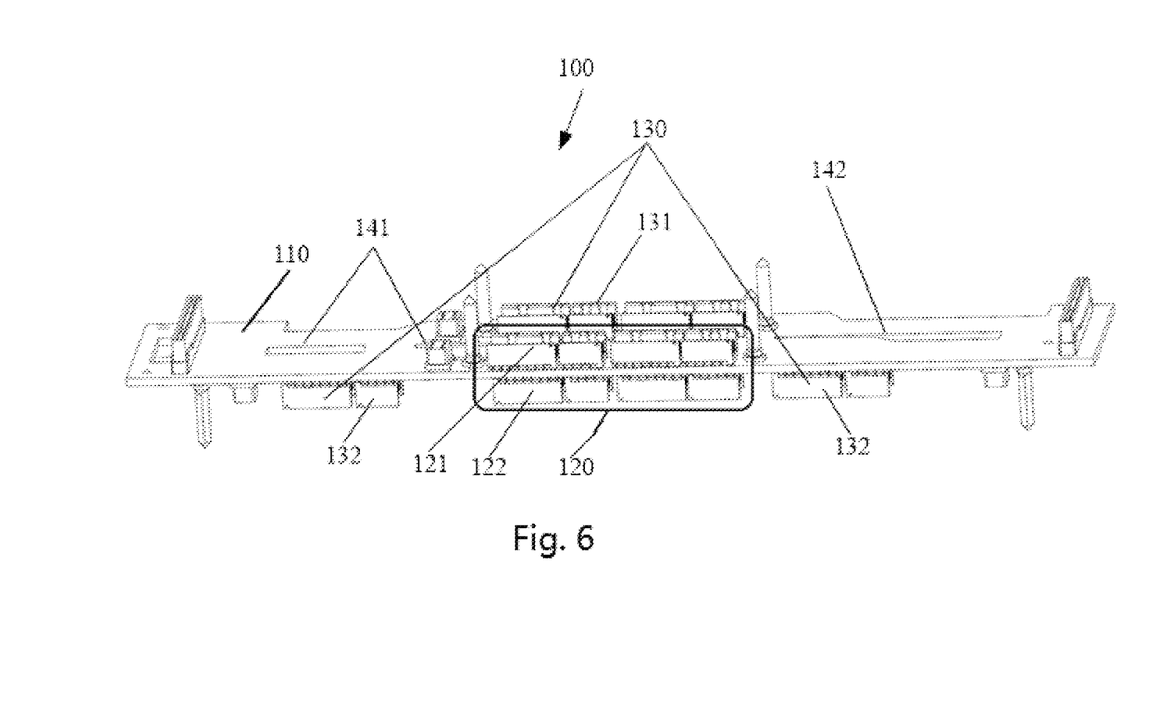
FIG. 6 shows backplane circuit and connectors placement according to the present disclosure.

As shown in FIG. 6, this embodiment provides a backplane 100. The backplane 100 includes at least a circuit board 110 and a first connector unit 120.

The main function of the backplane 100 is to "carry" the circuit board and assign functions such as power, signal to each daughter board to obtain proper electrical connections and signal transmission.

The circuit board 110 may be a circuit board 110 having any structure. In this embodiment, the specific structure of the circuit board 110 is not further described.

In this embodiment, the first connector unit 120 is connected with a control module (such as the control module 2 mentioned above), and the first connector unit 120 includes at least one first connector module.

The number of first connector modules included in the first connector unit 120 depends on the control module to be connected. For example, as shown in FIG. 6, the first connector unit 120 includes four first connector modules. The types of the first connector modules in each group are the same or at least one of them is different.

In this embodiment, each group of the first connector modules includes a front connector 121 and a back connector 122. The front connector 121 and the back connector 122 each includes at least two columns of pins. The front connector 121 and the back connector 122 may be connectors of the same type with the same number of pin columns. The front connector 121 and the back connector 122 also may be connectors of different types with different numbers of pin columns.

The pins in the odd-numbered columns of the front connector have the same arrangement as the pins in the odd-numbered columns of the back connector, the pins in the even-numbered columns of the front connector have the same arrangement as the pins in the even-numbered columns of the back connector. The front connector 121 is mounted on the front of the circuit board 110, and the back connector 122 is mounted on the back of the circuit board 110. The back connector 122 is staggered one column of pins relative to the front of the front connector 121, so that the signals on the front and back of the backplane 100 are directly connected, thereby reducing the wiring on the circuit board. Therefore, the required area of the circuit board and number of the circuit board layers for signal wiring are reduced, the costs are saved, the length of the high-speed signal wiring on the backplane 100 is the shortest. The signal attenuation of the high-speed signal wiring caused by the circuit board is minimized, the signal quality is improved. The area left for the ventilation holes of the backplane 100 is maximized, which strengthens the air flow and improves the heat dissipation.

Specifically, in this embodiment, the first column of the front connector 121 is vacantly connected, the second column to the Nth column of the front connector 121 are sequentially connected with the first column to the N−1th column of the back connector 122, respectively, and the Nth column of the back connector 122 is vacantly connected. Alternatively, the first column of the back connector 122 is vacantly connected, the second to the Nth columns of the back connector 122 are sequentially connected with the first to N−1th columns of the front connector 121, and the Nth column of the front connector 121 is vacantly connected. N is a positive integer and N≥2.

In an embodiment, the first connector unit 120 is disposed in any one of the upper left region, the upper middle region, the upper right region, the lower left region, the lower middle region, and lower right region of the circuit board 110.

In this embodiment, the backplane 100 further includes a second connector unit 130. The second connector unit 130 is also used to connect a control module (such as the control module 1 mentioned above). At this time, the backplane 100 may be connected with both control modules.

In this embodiment, the second connector unit 130 includes at least one group of second connector modules. Each group of the second connector modules includes a front connector 131 and a back connector 132. The front connector 131 in the second connector module is mounted on the front of the circuit board 110, the back connector 132 is mounted on the back of the circuit board 110. The back connector 132 is staggered the entire front connector 131.

In this embodiment, the number of the second connector modules included in the second connector unit 130 depends on the control module to be connected. For example, as shown in FIG. 6, the second connector unit 130 includes four second connector modules. The types of the second connector modules in each group are the same or at least one of them is different.

In this embodiment, the first connector unit 120 is disposed in the upper middle region or lower middle region of the circuit board 110. The front connector 131 of the second connector module of the second connector unit 130 is disposed in the lower middle region or the upper middle region of the circuit board 110. The back connector 132 is uniformly disposed on both sides of the back connector 122 in the first connector unit 120.

Figure 10:
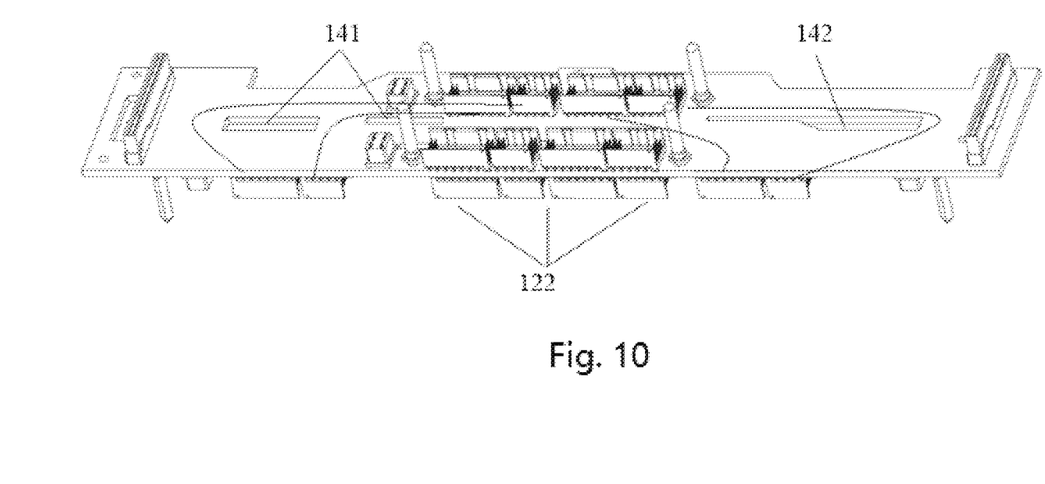
FIG. 10 shows backplane and connectors placement and signals routing according to the present disclosure.

In this embodiment, the circuit board 110 further includes a plurality of ventilation holes, such as the ventilation holes 141 and 142 shown in FIG. 10.

Taking the Molex Impact 3 pair series connector as an example, the layout of the circuit board 110 and the connector in the backplane 100 of this embodiment will be described in detail.

Figure 7:
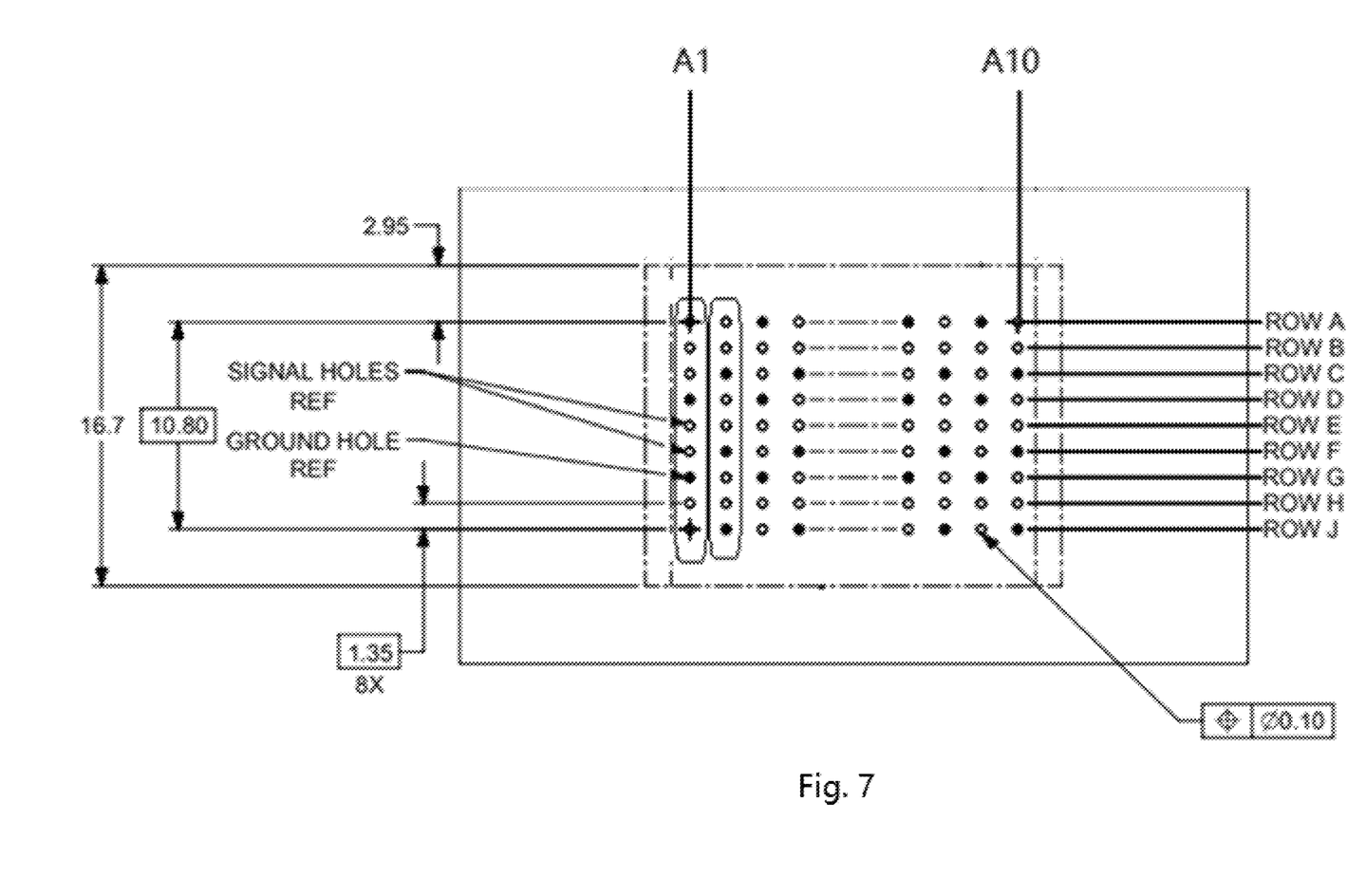
FIG. 7 shows definition of signal pins of the connector according to the present disclosure.

It is known from the pin definition diagram of the connector in FIG. 7 that there are 9 pins in each column. 3 pairs of differential signal pins (white dots in FIG. 7) and 3 ground pins (black dots in FIG. 7). The three pairs of differential signals in the odd-numbered column are staggered one pin relative to the three pairs of differential signals in the even-numbered column in the horizontal direction. All ground pins of this type of connector are interconnected within the connector body. Only the three pairs of differential signal pins are independent. In other words, all black dots are ground pins and can only be used as ground pins, while the white dot pins can be customized. Any other pins connected with any one of the black dots is regarded as a short to ground, and there is a huge risk to the circuit design.

Figure 8A:
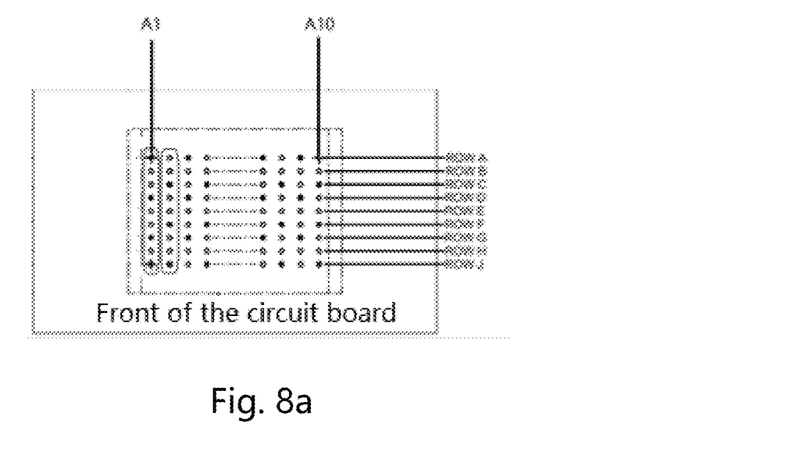
FIG. 8a shows signal pins of the connector on the front side of the backplane according to the present disclosure.
Figure 8B:
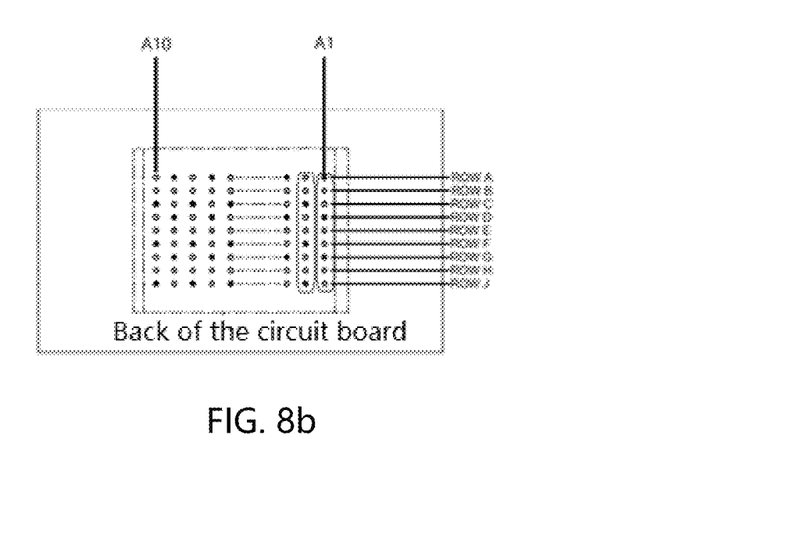
FIG. 8b shows signal pins of the connector on the back side of the backplane according to the present disclosure.

From left to right, A1 is the first pin in the first column. A10 is the first pin of the last column or column 10. When a group of connectors of the same type are placed on the front side and back side of the circuit board 110 at the same time, the pin A1 and the pin A10 on the front side connector (front connector 121) are corresponding to the pin A10 and the pin A1 on the back side connector (back connector 122), respectively, as shown in FIGS. 8a and 8b.

As shown in the structure of the backplane 100 in this embodiment, if the front side connector (front connector 121) and back side connector (back connector 122) are placed back-to-back and staggered one column, the three pairs of differential signal pins and the three ground pins on the front connector will perfectly match those on the back connector. Therefore, the risk of short circuit is avoided and signal straight-through is achieved.

Figure 9:
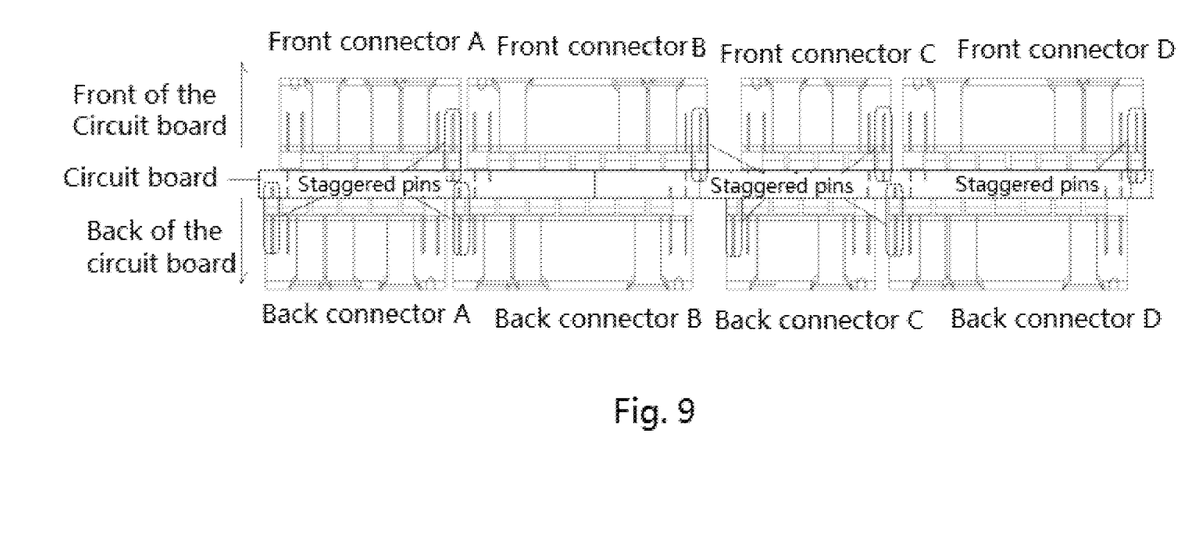
FIG. 9 is a perspective view showing the connectors placement according to the present disclosure.

As shown in FIG. 9, taking a connector with 10 columns as an example, "the front connector 121 is mounted on the front side of the circuit board 110, the back connector 122 is mounted on the back side of the circuit board 110, and the back connector 122 is connected with the front connector 121 and is staggered a column of pins relative to the front of the front connector 121 is referred as "staggered back-to-back connection". The "staggered back-to-back connection" is realized by: the first column of the back connector A is vacantly connected, the second column of the back connector A is connected with the 10th column of the front connector A, the third column of the back connector A is connected with the 9th column of the front connector A, the fourth column of the back connector A is connected with 8th column of the front connector, and so on. Until the last column A10 of the back connector A is connected with the second column of the front connector A. Finally, the first column of the front connector A will also be vacantly connected.

Taking the system with dual control modules and dual backplanes 100 shown in FIG. 3 as an example. Before adopting the staggered back-to-back connection method in this embodiment, the layout of the circuit board 110 is shown in FIG. 5. The signal wirings from the two control modules occupy a large area, only a very small area is left for the ventilation holes. In order to avoid the interference between the connectors on the front side and back side, the front connectors are completely staggered from the back connectors, and the three groups of connectors on the front side and back side occupy the most area of the lower part of the circuit board 110.

After adopting the staggered back-to-back connection method of the circuit board 110 and the controller in the backplane 100 in this embodiment, the layout of the backplane 100 is shown in FIG. 10. Only the second connector unit 130 (the control signal from the control module 1) needs to be wired on the circuit board 110. The signal of the first connector unit 120 (the control signal from the control module 2) reaches the other side of the circuit board 110 through the staggered back-to-back layout. The wirings on the connectors on both sides of the backplane are reduced by approximate ⅓, the wiring area required is greatly reduced, and the area for the ventilation holes is increased.

This present disclosure further provides a layout method for backplane connector. The method includes: providing a circuit board 110, and providing a first connector unit 120.

The first connector unit 120 includes at least one group of first connector modules, and each group of the first connector modules includes a front connector 121 and a back connector 122. The pins in the odd-numbered columns of the front connector have the same arrangement as the pins in the odd-numbered columns of the back connector, the pins in the even-numbered columns of the front connector have the same arrangement as the pins in the even-numbered columns of the back connector. The front connector 121 is mounted on the front of the circuit board 110, and the back connector 122 is mounted on the back of the circuit board 110. The back connector 122 is staggered one column of pins relative to the front of the front connector 121, so that the signals on the front and back of the backplane 100 are directly connected.

In this embodiment, the first column of the front connector 121 is vacantly connected, the second column to the Nth column of the front connector 121 are sequentially connected with the first column to the N−1th column of the back connector 122, respectively, and the Nth column of the back connector 122 is vacantly connected. Alternatively, the first column of the back connector 122 is vacantly connected, the second to the Nth columns of the back connector 122 are sequentially connected with the first to N−1th columns of the front connector 121, and the Nth column of the front connector 121 is vacantly connected. N is a positive integer and N≥2.

The principle of the layout method for the backplane connector in this embodiment is the same as the layout principle of the circuit board 110 and the connector in the backplane 100 described above, the same parts are not described again.

This present disclosure further provides an electronic terminal, including the backplane 100 described above. The backplane 100 is applied to an electronic terminal with a dual circuit board 110, in which two circuit boards 110 are connected by corresponding connectors. The electronic terminal may be a server, a memory, or an industrial computer. The backplane 100 is used as a first circuit board of a system with dual control modules and dual circuit boards. The first circuit board is connected with the first control module and the second control module, and is connected with the second circuit board by a cable.

In addition, to highlight the innovative part of the present disclosure, the embodiments do not introduce technical features that are not closely related to solving the technical problem proposed by the present disclosure, but this does not indicate that there are no other structures and functional features.

It needs to be stated that the drawings provided in the embodiments are just used for schematically describing the basic concept of the present disclosure, thus only illustrating components only related to the present disclosure and are not drawn according to the numbers, shapes, and sizes of components during actual implementation, the configuration, number and scale of each component during actual implementation thereof may be freely changed, and the component layout configuration thereof may be more complicated.

In summary, in the present disclosure, the signals on the front and back of the backplane are connected directly, which reduces the wiring on the circuit board, thereby reducing the area and number of layers of the circuit board required by signal wiring, and saving costs. the length of the high-speed signal wiring on the backplane is minimized, the signal attenuation of the high-speed signal wiring caused by the circuit board is minimized, and the signal quality is improved. In the present disclosure, fewer signal wirings are used, the front connector and back connector are overlapped, the large area is left for the ventilation holes of the backplane, thereby enhancing the air flow and improving the heat dissipation of the system. In the present disclosure, the area of the ventilation hole is increased, the demand for the power of the fan in the system is reduced, thereby reducing the cost of the fan in the system and further reducing the system cost. Therefore, the present disclosure effectively overcomes various shortcomings and has high industrial utilization value.

The above-mentioned embodiments are just used for exemplarily describing the principle and effects of the present disclosure instead of limiting the present disclosure. Those skilled in the art can make modifications or changes to the above-mentioned embodiments without going against the spirit and the range of the present disclosure. Therefore, all equivalent modifications or changes made by those who have common knowledge in the art without departing from the spirit and technical concept disclosed by the present disclosure shall be still covered by the claims of the present disclosure.

The invention claimed is:

1. A backplane, comprising:

a circuit board; and a first connector unit, wherein the first connector unit comprises at least one group of first connector modules, each group of the first connector modules comprises a front connector and a back connector, wherein pins in odd-numbered columns of the front connector have the same arrangement as pins in odd-numbered columns of the back connector, pins in even-numbered columns of the front connector have the same arrangement as pins in even-numbered columns of the back connector, and the front connector is placed on the front of the circuit board, the back connector is placed on the back of the circuit board, and the back connector is staggered one column of pins relative to the front of the front connector;

wherein a first column of the front connector is vacantly connected, a second column to an Nth column of the front connector are sequentially connected with a first column to an N−1 column of the back connector, an Nth column of the back connector is vacantly connected; alternatively, the first column of the back connector is vacantly connected, a second column to the Nth column of the back connector are sequentially connected with the first column to an N−1 column of the front connector, and the Nth column of the front connector is vacantly connected; N is a positive integer and N≥2.

2. The backplane according to claim 1, wherein the first connector unit is disposed in any one of an upper left region, an upper middle region, an upper right region, a lower left region, a lower middle region, and a lower right region of the circuit board.

3. The backplane according to claim 1, wherein the circuit board further comprises a plurality of ventilation holes.

4. The backplane according to claim 1, further comprising:

a second connector unit, wherein the second connector unit comprises at least one group of second connector modules; and each group of the second connector modules comprises a front connector and a back connector, wherein the front connector of the second connector module is mounted on the front of the circuit board, and the back connector of the second connector module is mounted on the back of the circuit board, and staggered the entire front connector of the second connector module.

5. The backplane according to claim 4, wherein the first connector unit is disposed in an upper middle region or a lower middle region of the circuit board; the front connector of the second connector module of the second connector unit is disposed in the lower middle region or upper middle region of the circuit board, and the back connector of the second connector module of the second connector unit is uniformly arranged on both sides of the back connector in the first connector unit.

6. A layout method for backplane connector, comprising providing a circuit board; and providing a first connector unit, wherein the first connector unit comprises at least one group of first connector modules, each group of the first connector modules comprises a front connector and a back connector, wherein pins in odd-numbered columns of the front connector have the same arrangement as pins in odd-numbered columns of the back connector, pins in even-numbered columns of the front connector have the same arrangement as pins in even-numbered columns of the back connector, and the front connector is placed on the front of the circuit board, the back connector is placed on the back of the circuit board, and the back connector is staggered one column of pins relative to the front of the front connector;

wherein a first column of the front connector is vacantly connected, a second column to an Nth column of the front connector are sequentially connected with a first column to an N−1 column of the back connector, an Nth column of the back connector is vacantly connected; alternatively, the first column of the back connector is vacantly connected, a second column to the Nth column of the back connector are sequentially connected with the first column to an N−1 column of the front connector, and the Nth column of the front connector is vacantly connected; N is a positive integer and N≥2.

7. An electronic terminal, comprising a backplane, wherein the backplane comprises:

a circuit board; and a first connector unit, wherein the first connector unit comprises at least one group of first connector modules, each group of the first connector modules comprises a front connector and a back connector, wherein pins in odd-numbered columns of the front connector have the same arrangement as pins in odd-numbered columns of the back connector, pins in even-numbered columns of the front connector have the same arrangement as pins in even-numbered columns of the back connector, and the front connector is placed on the front of the circuit board, the back connector is placed on the back of the circuit board, and the back connector is staggered one column of pins relative to the front of the front connector;

wherein a first column of the front connector is vacantly connected, a second column to an Nth column of the front connector are sequentially connected with a first column to an N−1 column of the back connector, an Nth column of the back connector is vacantly connected; alternatively, the first column of the back connector is vacantly connected, a second column to the Nth column of the back connector are sequentially connected with the first column to an N−1 column of the front connector, and the Nth column of the front connector is vacantly connected; N is a positive integer and N≥2.

* * * * *